(12) United States Patent
Lee et al.

(10) Patent No.: US 10,383,239 B2
(45) Date of Patent: Aug. 13, 2019

(54) FOLDABLE DISPLAY DEVICE

(71) Applicant: SAMSUNG DISPLAY CO., LTD., Yongin-si, Gyeonggi-do (KR)

(72) Inventors: Ah-Ram Lee, Cheonan-si (KR); Sung Chul Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/798,890

(22) Filed: Oct. 31, 2017

(65) Prior Publication Data

US 2018/0242466 A1    Aug. 23, 2018

(30) Foreign Application Priority Data

Feb. 22, 2017    (KR) .......................... 10-2017-0023606

(51) Int. Cl.
*G06F 1/16* (2006.01)
*H05K 5/00* (2006.01)
*H05K 5/02* (2006.01)
*G09F 9/30* (2006.01)

(52) U.S. Cl.
CPC ......... *H05K 5/0017* (2013.01); *G06F 1/1652* (2013.01); *G09F 9/301* (2013.01); *H05K 5/0217* (2013.01)

(58) Field of Classification Search
CPC .... G06F 1/1616; G06F 1/1624; G06F 1/1637; G06F 1/1681; G06F 1/1652; H05K 5/0217
See application file for complete search history.

(56) References Cited

U.S. PATENT DOCUMENTS

| 9,173,287 | B1 * | 10/2015 | Kim | ...................... | H05K 1/028 |
| 9,173,288 | B1 * | 10/2015 | Kim | ...................... | G06F 1/1633 |
| 9,176,535 | B2 | 11/2015 | Bohn et al. | | |
| 9,235,239 | B2 * | 1/2016 | van Dijk | ............... | G06F 1/1652 |
| 9,603,271 | B2 * | 3/2017 | Lee | ...................... | H05K 5/0017 |

(Continued)

FOREIGN PATENT DOCUMENTS

| KR | 10-2014-0026547 A | 3/2014 |
| KR | 10-2015-0105138 A | 9/2015 |

(Continued)

*Primary Examiner* — Hoa C Nguyen
*Assistant Examiner* — Christopher L Augustin
(74) *Attorney, Agent, or Firm* — Lewis Roca Rothgerber Christie LLP

(57) ABSTRACT

A foldable display device includes a flexible display panel including a bendable area; and a first supporter including a first multi-joint member, a complex support unit, and a second multi-joint member consecutively arranged in a first direction, and supporting the bendable area, and the complex support unit includes: a flat support unit combined to the first multi-joint member and the second multi-joint member in a rotatable manner with respect to a combination axis in parallel to a second direction crossing the first direction; and a curved support unit neighboring the flat support unit in the second direction and combined to the first multi-joint member and the second multi-joint member such that a rising height of the curved support unit changes in a third direction according to a rotation state of the flat support unit relative to the first multi-joint member and the second multi-joint member.

19 Claims, 15 Drawing Sheets

(56) References Cited

U.S. PATENT DOCUMENTS

| | | | |
|---|---|---|---|
| 9,625,947 B2* | 4/2017 | Lee | G06F 1/1616 |
| 9,625,955 B2* | 4/2017 | Liao | G06F 1/1681 |
| 9,710,021 B2* | 7/2017 | Kauhaniemi | G06F 1/1652 |
| 9,760,126 B2* | 9/2017 | Shin | G06F 1/1652 |
| 9,772,659 B2* | 9/2017 | Xin | G06F 1/1681 |
| 9,786,207 B2* | 10/2017 | Kim | G09F 9/301 |
| 9,910,458 B2* | 3/2018 | Watanabe | G06F 1/1652 |
| 9,980,402 B2* | 5/2018 | Huitema | H05K 5/0226 |
| 10,185,364 B2* | 1/2019 | Seo | G06F 1/1652 |
| 10,234,905 B2* | 3/2019 | Chen | G06F 1/1652 |
| 10,234,907 B2* | 3/2019 | Knoppert | G06F 1/1681 |
| 2012/0307423 A1 | 12/2012 | Bohn et al. | |
| 2013/0037228 A1 | 2/2013 | Verschoor et al. | |
| 2016/0334836 A1* | 11/2016 | Hong | G06F 1/1616 |

FOREIGN PATENT DOCUMENTS

| | | | |
|---|---|---|---|
| KR | 10-2016-0083318 A | 7/2016 | |
| WO | WO 2012-167204 A2 | 12/2012 | |

* cited by examiner

FOLDABLE DISPLAY DEVICE

CROSS-REFERENCE TO RELATED APPLICATION

This application claims priority to and the benefit of Korean Patent Application No. 10-2017-0023606, filed on Feb. 22, 2017 in the Korean Intellectual Property Office, the entire content of which is incorporated herein by reference.

BACKGROUND

1. Field

Aspects of embodiments of the present disclosure relate to a foldable display device.

2. Description of the Related Art

A flexible display panel is a display panel in which a plurality of pixels is disposed on a flexible substrate, such as a plastic film, and has a property of being easily bent. Recently, a foldable display device using a flexible display panel has been under research and development. The foldable display device includes a panel supporter for supporting a flexible display panel. The panel supporter has a switchable structure of an unfolded state and a folded state.

Part of the flexible display panel is bent while it is folded, and a bending degree must be less than a threshold value determined in consideration of a characteristic of a material that is weak in deformation from among a plurality of materials configuring the flexible display panel, such as an inorganic material, for example. The life span of the foldable display device may be longer when the stress applied to the flexible display panel is reduced while the foldable display device is folded.

The above information disclosed in this Background section is only for enhancement of understanding of the background of the described technology and, therefore, it may contain information that does not form the prior art that is already known in this country to a person of ordinary skill in the art.

SUMMARY

According to an aspect of embodiments of the present disclosure, a display device includes a novel structure of a panel supporter. According to another aspect of embodiments of the present disclosure, a display device has a reduced or minimized stress provided to a flexible display panel while the display device is folded.

According to one or more exemplary embodiments, a foldable display device includes a flexible display panel including a bendable area; and a first supporter including a first multi-joint member, a complex support unit, and a second multi-joint member consecutively arranged in a first direction, and supporting the bendable area, and the complex support unit includes: a flat support unit combined to the first multi-joint member and the second multi-joint member in a rotatable manner with respect to a combination axis in parallel to a second direction crossing the first direction; and a curved support unit neighboring the flat support unit in the second direction and combined to the first multi-joint member and the second multi-joint member such that a rising height of the curved support unit changes in a third direction crossing the first direction and the second direction according to a rotation state of the flat support unit relative to the first multi-joint member and the second multi-joint member.

The flat support unit and the curved support unit may be alternately and repeatedly arranged in the second direction crossing the first direction. The first multi-joint member may include a plurality of first supporting sides, and the second multi-joint member may include a plurality of second supporting sides. The flat support unit may include a flat supporting side parallel to the first supporting sides and the second supporting sides in an unfolded state.

The curved support unit may include a curved supporting side having an arc shape in a cross-sectional view, and in the unfolded state, an uppermost end of the curved supporting side may be provided in parallel to the flat supporting side. The curved supporting side may have a circular arc shape in the cross-sectional view.

The curved support unit may include a first link connector fixed to a lower portion of the curved supporting side. The first multi-joint member and the second multi-joint member may respectively include a second link connector and a third link connector neighboring the first link connector.

The complex support unit may further include a first link member and a second link member. Respective ends of the first link member may be hinge-combined to the first link connector and the second link connector, and respective ends of the second link member may be hinge-combined to the first link connector and the third link connector.

The first link connector may be provided as a pair of first link connectors. One of the pair of first link connectors may be combined to the first link member, and the other of the pair of first link connectors may be combined to the second link member.

The flexible display panel may further include a flat area contacting the bendable area. The foldable display device may further include a second supporter for supporting the flat area. The flat area may be attached to the second supporter.

The bendable area may not be attached to the first supporter. In another way, the bendable area may be attached to the curved support unit by a first adhesive layer. The first adhesive layer in the first direction may be narrower than the curved support unit in the first direction.

According to another exemplary embodiment, a foldable display device includes a flexible display panel and a first supporter. The flexible display panel includes a bendable area. The first supporter includes a first multi-joint member, a complex support unit, and a second multi-joint member consecutively arranged in a first direction, and supports the bendable area. The complex support unit includes a flexible board and a curved support unit. The flexible board includes respective ends in the first direction that are fixed to the first multi-joint member and the second multi-joint member. The curved support unit overlaps with the flexible board, and includes a curved supporting side facing the flexible board.

The curved supporting side may have an arc shape in a cross-sectional view. In an unfolded state, the flexible board may be flat and may contact a central part of the curved supporting side. The curved supporting side may have a circular arc shape in the cross-sectional view. The flexible board may be bent along the curved supporting side in a folded state. A contact area of the flexible board and the curved supporting side in the folded state may be greater than a contact area of the flexible board and the curved supporting side in the unfolded state.

Respective sides of the curved support unit in the first direction may be spaced apart from the first multi-joint member and the second multi-joint member in the unfolded state, and may contact a side of the first multi-joint member and a side of the second multi-joint member in the folded state.

Respective ends of the curved support unit in a second direction crossing the first direction may be combined to the first multi-joint member and the second multi-joint member by a third link member and a fourth link member.

According to an aspect of exemplary embodiments, in the folded state, the bendable area is bent with a curvature that is close to a natural curvature and does not include a portion forcibly bent by an external force. Therefore, the foldable display device may minimize or reduce a stress applied to the flexible display panel in the folded state, and may prevent or substantially prevent the flexible display panel from being damaged.

DETAILED DESCRIPTION

Figure 1:
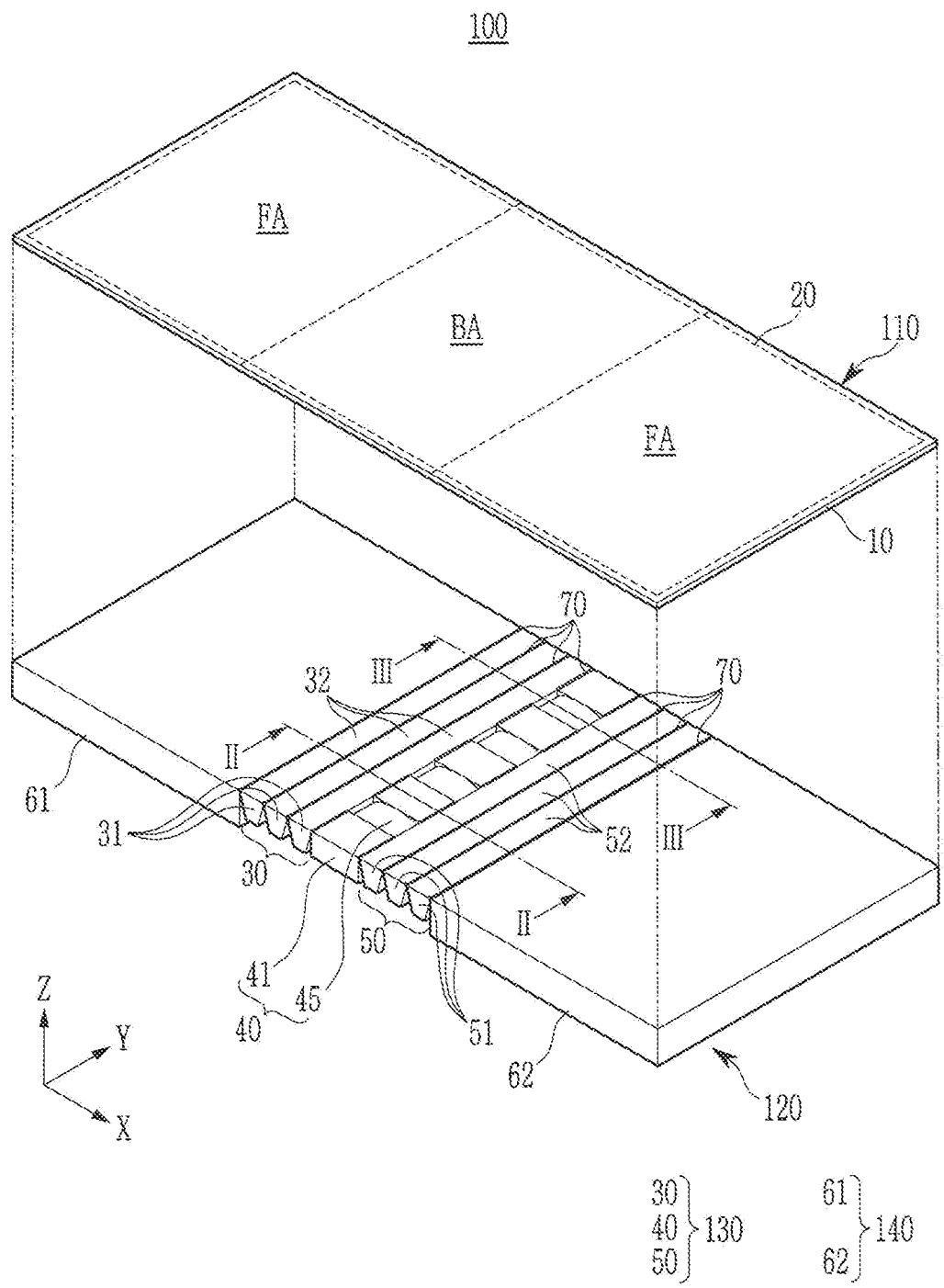
FIG. 1 shows an exploded perspective view of a foldable display device in an unfolded state according to an exemplary embodiment.

The present disclosure will be described more fully hereinafter with reference to the accompanying drawings, in which some exemplary embodiments of the disclosure are shown. As those skilled in the art would realize, the described embodiments may be modified in various different ways, all without departing from the spirit or scope of the present disclosure.

Accordingly, the drawings and description are to be regarded as illustrative in nature and not restrictive, and like reference numerals designate like elements throughout the specification.

The size and thickness of each configuration shown in the drawings may be arbitrarily shown for better understanding and ease of description, and the present disclosure is not limited thereto. In the drawings, the thicknesses of layers, films, panels, regions, etc., may be exaggerated for clarity. For better understanding and ease of description, the thicknesses of some layers and areas may be exaggerated.

It is to be understood that when an element such as a layer, film, region, or substrate is referred to as being "on" another element, it can be directly on the other element, or one or more intervening elements may also be present. In contrast, when an element is referred to as being "directly on" another element, there are no intervening elements present.

The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of other elements.

The phrase "on a plane" means viewing the object portion from the top, and the phrase "on a cross-section" means viewing a cross-section of which the object portion is vertically cut from the side.

Figure 2:
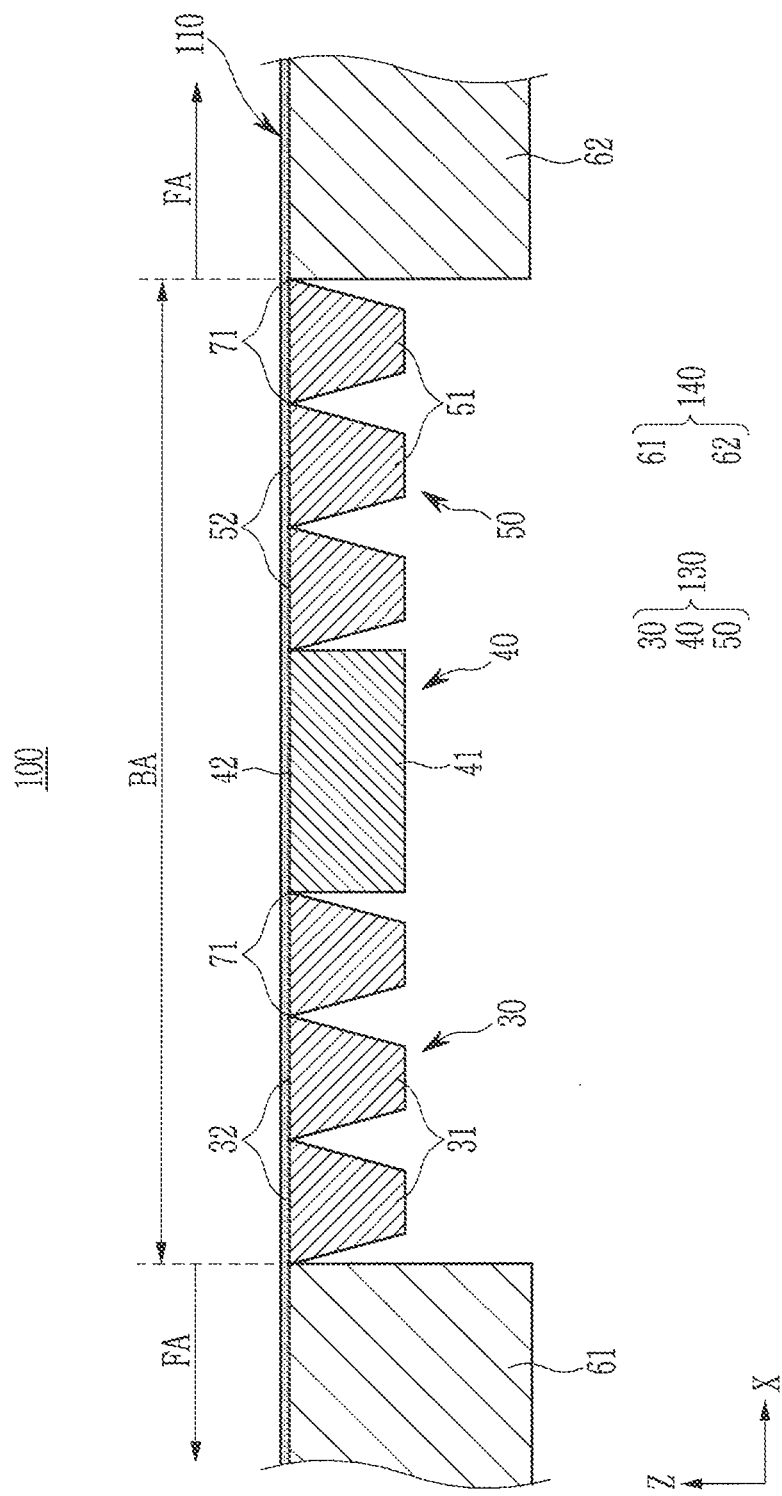
FIG. 2 shows a cross-sectional view of the foldable display device of FIG. 1 in a combined state, taken along the line II-II.

FIG. 1 shows an exploded perspective view of a foldable display device in an unfolded state according to an exemplary embodiment. FIG. 2 shows a cross-sectional view of the foldable display device of FIG. 1 in a combined state, taken along the line II-II of FIG. 1; and FIG. 3 shows a cross-sectional view of the foldable display device of FIG. 1 in a combined state, taken along the line III-III of FIG. 1.

Figure 3:
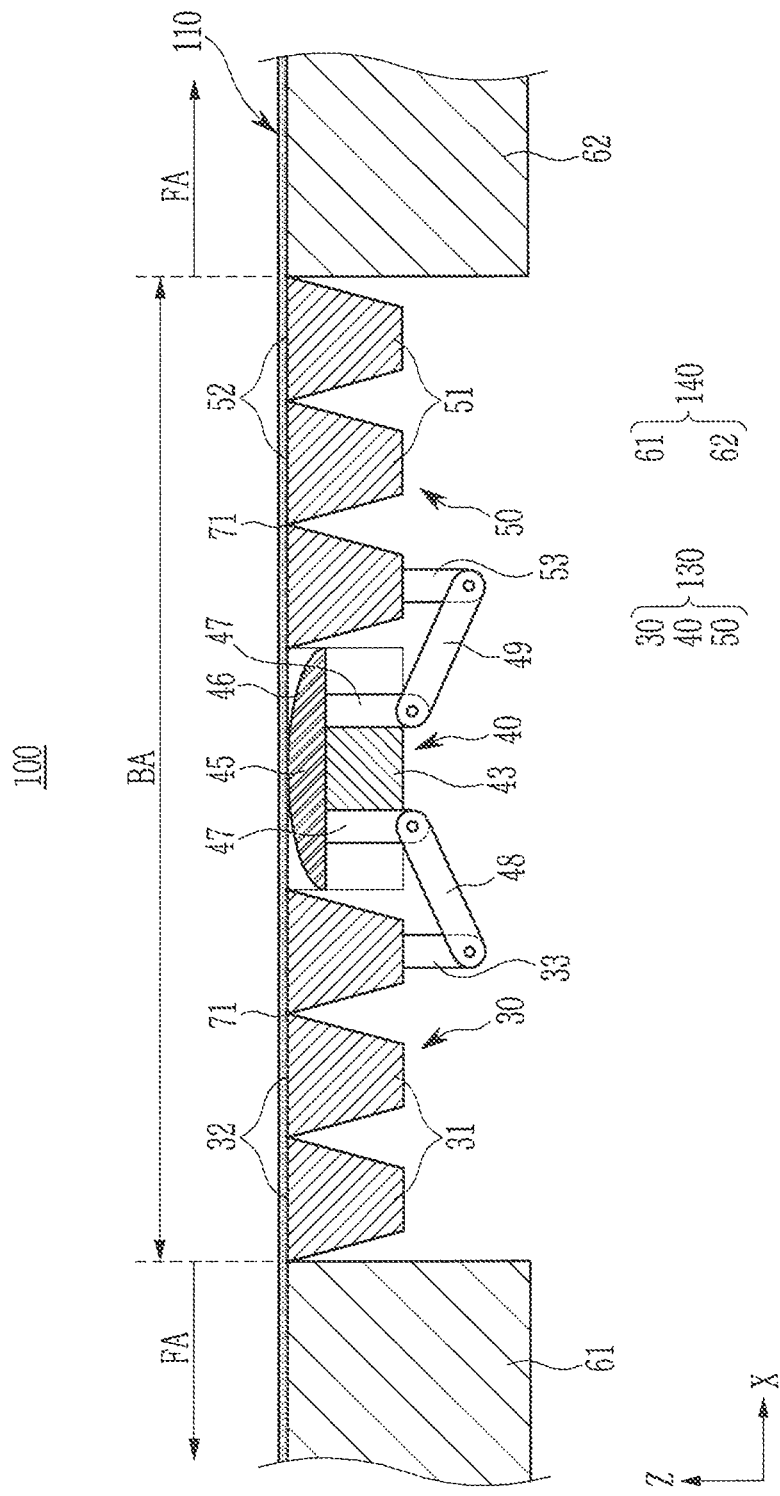
FIG. 3 shows a cross-sectional view of the foldable display device of FIG. 1 in a combined state, taken along the line III-III.

Referring to FIG. 1 to FIG. 3, a foldable display device 100 according to an exemplary embodiment includes a flexible display panel 110, and a panel supporter 120 combined to the flexible display panel 110 to support the flexible display panel 110.

The flexible display panel 110 includes a flexible substrate 10 and a display unit 20 provided on the flexible substrate 10. In an embodiment, the flexible substrate 10 may include a plastic film, and the display unit 20 may include a plurality of pixels and a plurality of driving circuits. The flexible display panel 110 may be any of an organic light emitting panel, a liquid crystal panel, and an electrophoretic display panel; however, the present invention is not limited thereto.

The flexible display panel 110 is divided into a flat area FA and a bendable area BA. In an embodiment, for example, the flexible display panel 110 may be divided into a bendable area BA provided at a center thereof, and a plurality of flat areas FA provided at respective sides of the bendable area BA. Two flat areas FA are separated in a first direction (e.g., an X-direction), and the bendable area BA is provided between the flat areas FA.

The panel supporter 120 includes a first supporter 130 for supporting the bendable area BA and a second supporter 140 for supporting the flat area FA. In an embodiment, the first supporter 130 may include a first multi-joint member 30, a complex support unit 40, and a second multi-joint member 50 consecutively arranged in the first direction (e.g., the X-direction). The second supporter 140 may include a plurality of supporting plates 61 and 62.

The first multi-joint member 30 includes a plurality of first joint units 31 consecutively arranged in the first direction (e.g., the X-direction). The first joint units 31 may respectively have a bar shape extending in a second direction (e.g., a Y-direction) crossing the first direction (e.g., the X-direction), and may respectively have a trapezoidal shape in a cross-sectional view. The first joint units 31 respectively include a first supporting side 32 facing the bendable area BA. In the unfolded state, a plurality of first supporting sides 32 are provided in parallel to each other.

The second multi-joint member 50 includes a plurality of second joint units 51 consecutively arranged in the first direction (e.g., the X-direction). The second joint units 51 may respectively have a bar shape extending in the second direction (e.g., the Y-direction), and may respectively have a trapezoidal shape in a cross-sectional view. The second joint units 51 respectively include a second supporting side 52 facing the bendable area BA. In the unfolded state, a plurality of second supporting sides 52 are provided in parallel to each other.

The complex support unit 40 includes a plurality of flat support units 41 and a plurality of curved support units 45. In an embodiment, the flat support units 41 and the curved support units 45 may be alternately and repeatedly disposed or arranged in the second direction (e.g., the Y-direction). The flat support units 41 respectively include a flat supporting side 42 facing the bendable area BA, and the curved support units 45 respectively include a curved supporting side 46 facing the bendable area BA.

The flat supporting side 42 is parallel to the first supporting side 32 and the second supporting side 52 in the unfolded state. The curved supporting side 46 has a curvature, and may have a convex arc shape, and, in an embodiment, may have a convex circular arc shape. In the unfolded state, an uppermost portion of the curved supporting side 46 may be parallel to the flat supporting side 42, and respective ends of the curved supporting side 46 may be lower than the flat supporting side 42.

A plurality of supporting plates 61 and 62, first joint units 31, second joint units 51, and flat support units 41 may be combined to each other by a plurality of combiners 70. The combiners 70 may respectively include a combination axis 71 provided in parallel to the second direction (e.g., the Y-direction) and may be allowable to be rotated or bent. The respective first joint units 31, the respective second joint units 51, and the respective flat support units 41 may rotate with respect to a plurality of combination axes 71.

In an embodiment, for example, the combiner 70 may be configured to be a hinge assembly with a hinge axis, and the combination axis 71 may be configured to be a hinge axis. In another embodiment, the combiner 70 may be made of a flexible material unit that is bent by an external force. In an embodiment, the flexible material unit may include a rubber material, such as silicon or polyurethane, and a portion that is bent in the folded state from among the flexible material unit may function as the combination axis 71.

Figure 4:
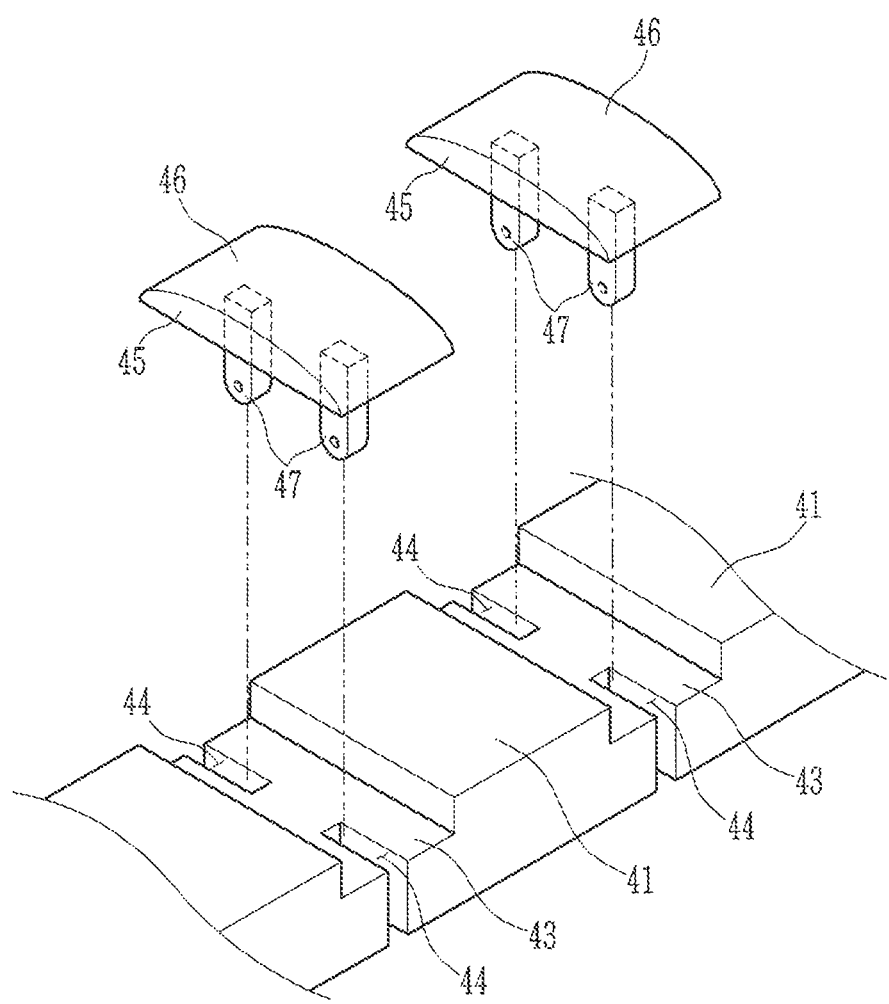
FIG. 4 shows an exploded perspective view of a complex support unit of the foldable display device shown in FIG. 1.

FIG. 4 shows an exploded perspective view of a complex support unit of the foldable display device 100, according to an exemplary embodiment.

Referring to FIG. 3 and FIG. 4, a plurality of curved support units 45 respectively include a pair of first link connectors 47 fixed to a lower portion. The pair of first link connectors 47 may have a bar shape extending in a third direction (e.g., a Z-direction) and may neighbor each other in the first direction (e.g., the X-direction).

The first multi-joint member 30 includes a plurality of second link connectors 33 fixed to one first joint unit 31 neighboring the complex support unit 40 from among the plurality of first joint units 31. The second multi-joint member 50 includes a plurality of third link connectors 53 fixed to one second joint unit 51 neighboring the complex support unit 40 from among the plurality of second joint units 51.

The second link connectors 33 may be fixed to a lower side of the first joint unit 31, and may have a bar shape extending in the third direction (e.g., the Z-direction). The third link connectors 53 may be fixed to a lower side of the second joint unit 51, and may have a bar shape extending in the third direction (e.g., the Z-direction). The second link connectors 33 and the third link connectors 53, while in the unfolded state, neighbor the pair of first link connectors 47 in the first direction (e.g., the X-direction).

A pair of first link connectors 47 may be link-combined to the second link connector 33 and the third link connector 53 by a first link member 48 and a second link member 49, respectively. For example, respective ends of the first link member 48 may be hinge-combined to the second link connector 33 and one of the first link connectors 47 neighboring the second link connector 33. Respective ends of the second link member 49 may be hinge-combined to the third link connector 53 and the other of the first link connectors 47 neighboring the third link connector 53.

The complex support unit 40 may include a prop 43 for supporting the curved support unit 45 in an unfolded state. The prop 43 is provided between a plurality (e.g., a pair) of neighboring flat support units 41 in the second direction (e.g., the Y-direction), and a pair of through holes 44 may be provided on respective sides of the prop 43 in the first direction (e.g., the X-direction). The pair of through holes 44 are opened toward the first joint unit 31 and the second joint unit 51, and a pair of first link connectors 47, a part of the first link member 48, and a part of the second link member 49 are provided in the pair of through holes 44.

Referring to FIG. 2 and FIG. 3, in an embodiment, the flat area FA of the flexible display panel 110 may be attached to the second supporter 140, and the bendable area BA may not be attached to the first supporter 130. That is, the bendable area BA may contact the first supporter 130 or may maintain a floating state on the first supporter 130. The bendable area BA is not limited to the first supporter 130, and is transformed corresponding to a shape shift of the first supporter 130.

Figure 5:
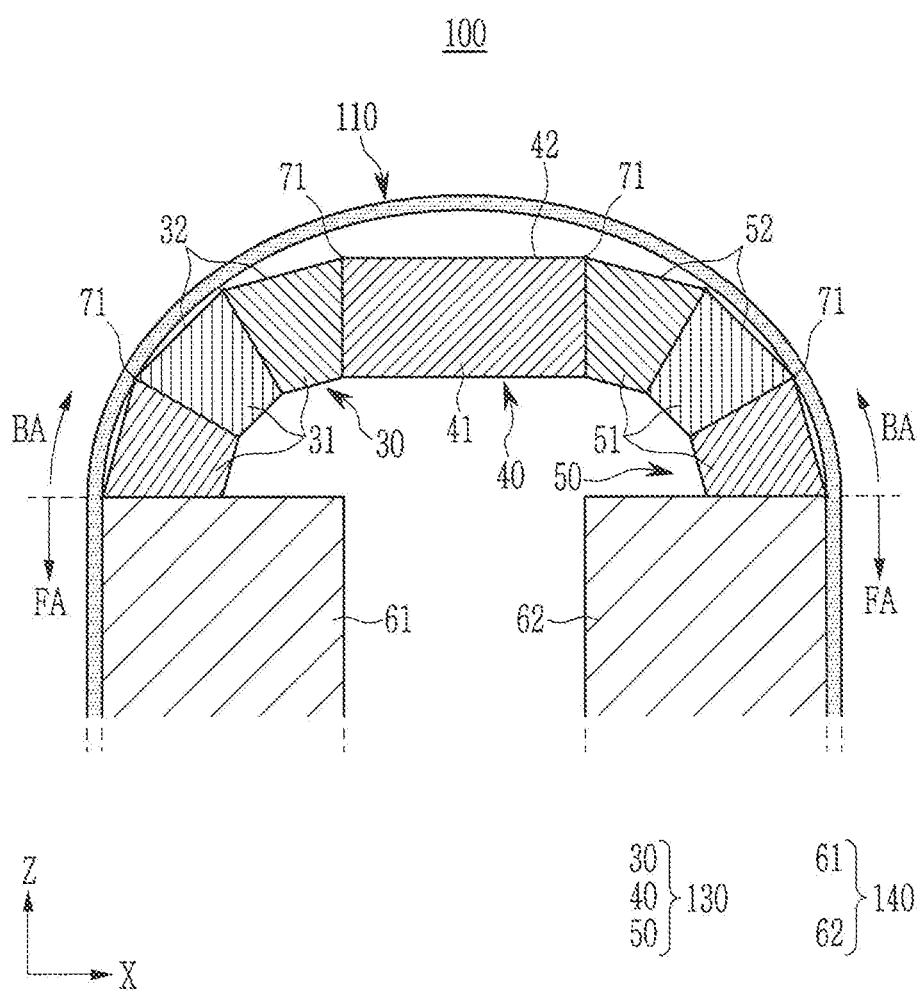
FIG. 5 shows a cross-sectional view of the foldable display device of FIG. 1, taken along the line II-II, in a folded state.
Figure 6:
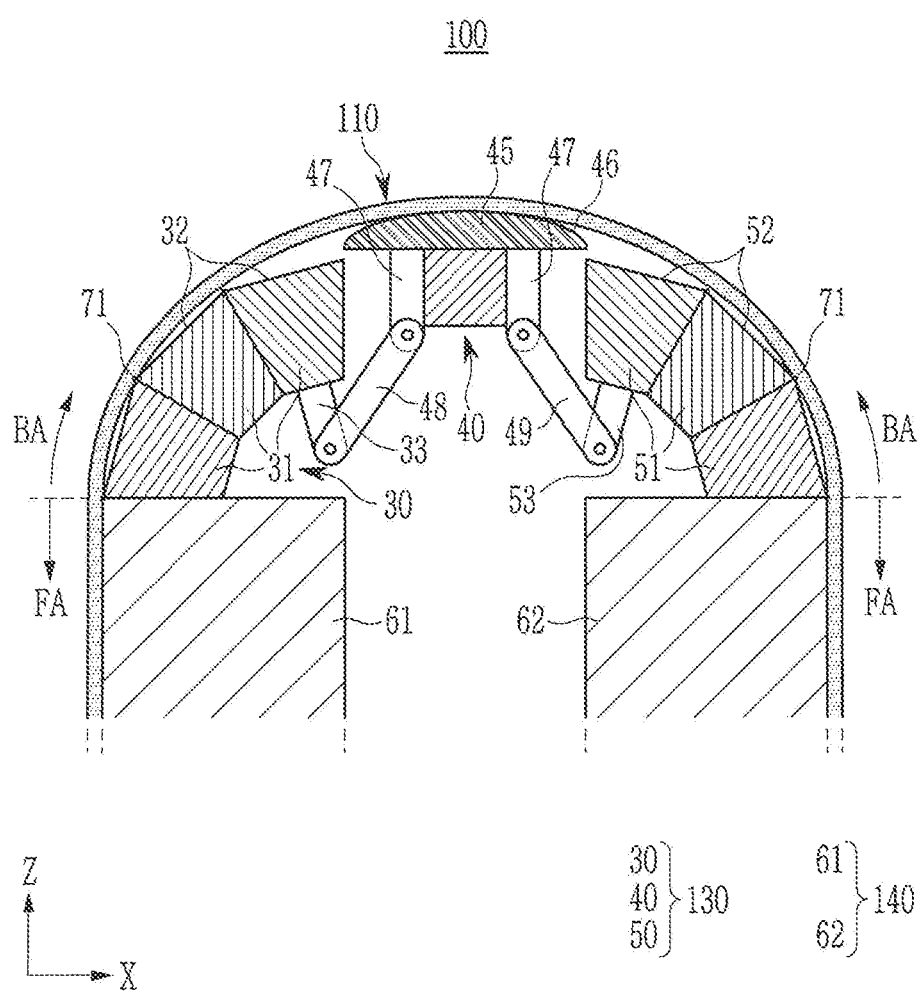
FIG. 6 shows a cross-sectional view of the foldable display device of FIG. 1, taken along the line III-III, in a folded state.

FIG. 5 shows a cross-sectional view of the foldable display device 100 in a folded state, taken along the line II-II of FIG. 1; and FIG. 6 shows a cross-sectional view of the foldable display device 100 in a folded state, taken along the line III-III of FIG. 1.

Referring to FIG. 5 and FIG. 6, the foldable display device 100 is switched to the folded state when the plurality of first joint units 31 and the plurality of second joint units 51 rotate with respect to their combination axes 71, and the bendable area BA of the flexible display panel 110 is bent to have an arc shape (e.g., a circular arc shape).

In the folded state, sides of the plurality of first joint units 31 are closely contacting or attached to each other, and sides of a plurality of second joint units 51 are closely contacting or attached to each other. The plurality of first supporting sides 32 and the plurality of second supporting sides 52 may respectively correspond to an arc (e.g., a circular arc) of 90°. Respective sides of the flat support unit 41 are closely contacting or attached to the side of the first joint unit 31 and the side of the second joint unit 51, and the supporting plates 61 and 62 face each other. The bendable area BA may be bent to have a semicircular shape in a cross-sectional view.

The second link connector 33 of the first multi-joint member 30 rotates and moves toward the complex support unit 40 by rotation of the first joint unit 31. The third link connector 53 of the second multi-joint member 50 rotates and moves toward the complex support unit 40 by rotation of the second joint unit 51. According to the rotation and movement of the second link connector 33 and the third link connector 53, the first link member 48 and the second link member 49 lift the pair of first link connectors 47.

Resultantly, a plurality of curved support units 45 rise in the folded state by the first link member 48 and the second link member 49, and the curved supporting side 46 of the curved support unit 45 protrudes toward the bendable area BA that is further bent than the flat supporting side 42 of the flat support unit 41. When the foldable display device 100 is switched again to the unfolded state, a plurality of curved support units 45 fall (refer again to FIG. 3).

As described, a plurality of curved support units 45 change a rising height with respect to the flat support unit 41 depending on the rotation state of the flat support unit 41 regarding the first multi-joint member 30 and the second multi-joint member 50 or, in other words, depending on the unfolded and folded states of the first multi-joint member 30 and the second multi-joint member 50. In this instance, the rising height of the curved support unit 45 refers to a rising height in the third direction (e.g., the Z-direction).

In an embodiment, the bendable area BA that is not attached to the first supporter 130 is bent with a curvature that is close to a natural curvature in the folded state. Here, the natural curvature signifies a curvature within which the bendable area BA is naturally bent according to the change of distance between respective ends when an external force is applied to the respective ends of the bendable area BA.

In this instance, the first multi-joint member 30 and the second multi-joint member 50 approach the bendable area BA to support the bendable area BA, and a plurality of curved support units 45 rise upward to support the bendable area BA. Therefore, in the folded state, the bendable area BA is bent with a curvature that is close to the natural curvature, and it is stably supported by the first multi-joint member 30, the second multi-joint member 50, and a plurality of curved support units 45, thereby preventing or substantially preventing damage, being pressed, and being deformed by external impacts.

In the folded state, a plurality of flat support units 41 are separated from the bendable area BA and do not support the bendable area BA, and in the unfolded state, a plurality of flat support units 41 support the bendable area BA. That is, the bendable area BA is supported in the unfolded state by a plurality of flat support units 41, and is supported in the folded state by a plurality of curved support units 45.

In an embodiment, a plurality of flat support units 41 and a plurality of curved support units 45 are alternately arranged in the second direction (e.g., the Y-direction), such that when a part of the bendable area BA is not supported in the unfolded state or the folded state, it does not result in an overall defect.

Figure 7:
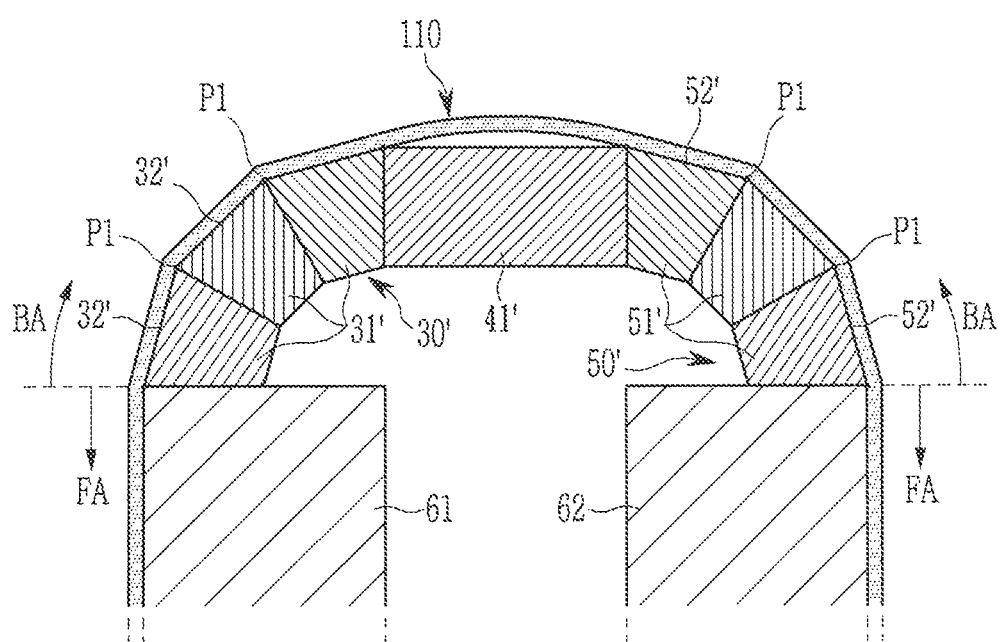
FIG. 7 shows a cross-sectional view of a foldable display device in a folded state according to a comparative example.

FIG. 7 shows a cross-sectional view of a foldable display device in a folded state according to a comparative example.

Referring to FIG. 7, regarding the foldable display device according to the comparative example, a first supporter includes a first multi-joint member 30', a flat support unit 41', and a second multi-joint member 50', and does not include the curved support unit 45 described above. A bendable area BA of a flexible display panel 110 is attached to the first multi-joint member 30' and the second multi-joint member 50', and the flexible display panel 110 is not attached to the flat support unit 41'.

In this case, in the folded state, the bendable area BA is bent at a plurality of first points P1 where a plurality of neighboring first supporting sides 32' meet and where a plurality of neighboring second supporting sides 52' meet, and a large stress is generated at the bent portions. The state of being bent at the bendable area BA and the rising of stress caused by the same increase a probability of damage of a layer that is sensitive to transformation from among multilayers configuring the flexible display panel 110.

For example, the flexible display panel 110 may be configured with multilayers such as a flexible substrate, a display unit, an encapsulation layer, a touch sensor, a polarization film, and a cover window. In this instance, a hard coating layer of the cover window or an inorganic insulating layer of the display unit has a brittle property, and it may be easily damaged by transformation. Therefore, regarding the display device according to the comparative example, in the folded state, a specific layer of the flexible display panel 110 may be damaged with a high possibility by a steep rise of stress.

By contrast, as shown in FIG. 5 and FIG. 6, regarding the foldable display device 100 according to an exemplary embodiment of the present invention, the bendable area BA is bent with a curvature that is close to a natural curvature, and there may be no portion that is forcibly bent by an external force.

Therefore, the foldable display device 100 according to an exemplary embodiment may minimize or reduce the stress applied to the flexible display panel 110 in the folded state and may prevent or substantially prevent the flexible display panel 110 from being damaged.

Figure 8:
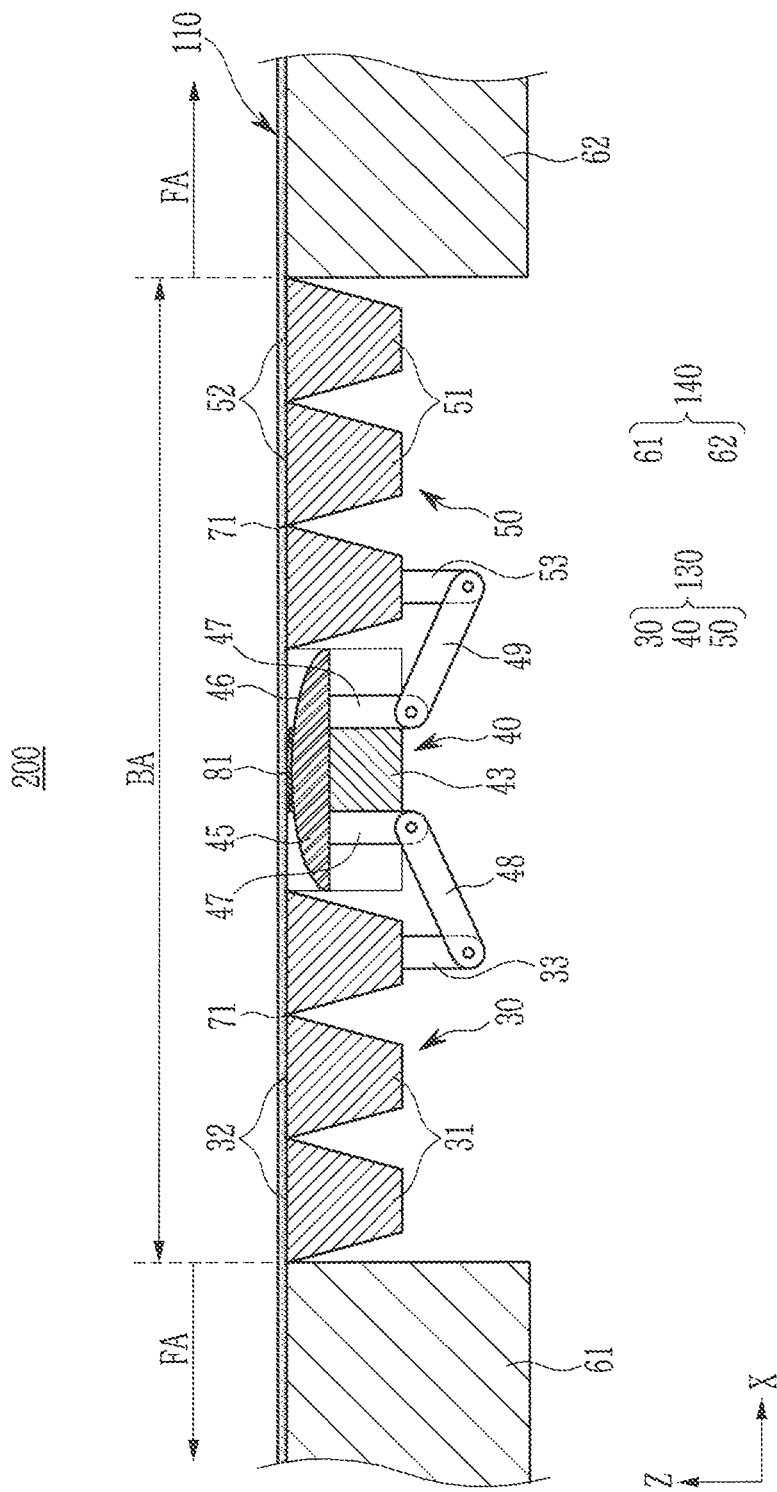
FIG. 8 shows a cross-sectional view of a foldable display device in an unfolded state according to another exemplary embodiment.
Figure 9:
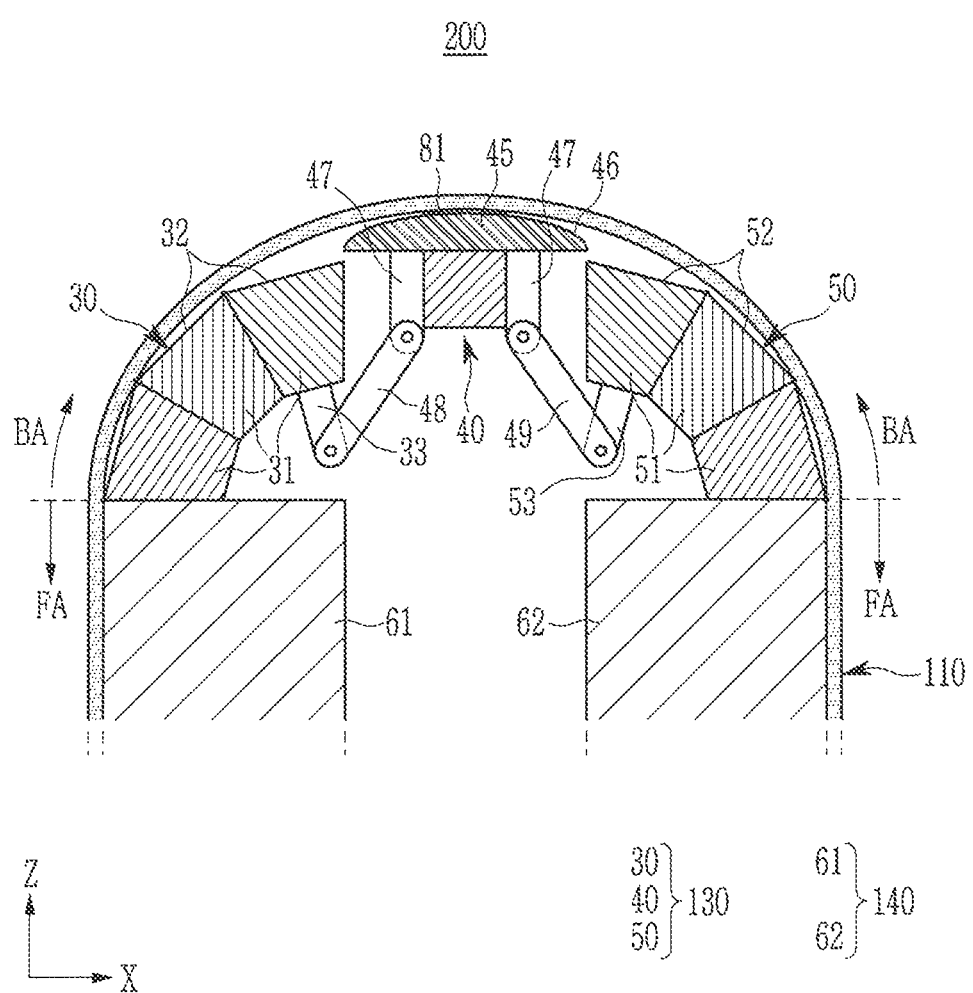
FIG. 9 shows a cross-sectional view of the foldable display device shown in FIG. 8, in a folded state.

FIG. 8 shows a cross-sectional view of a foldable display device in an unfolded state according to another exemplary embodiment; and FIG. 9 shows a cross-sectional view of a foldable display device shown in FIG. 8 in a folded state.

Referring to FIG. 8 and FIG. 9, regarding a foldable display device 200 according to another exemplary embodiment, a plurality of curved support units 45 may respectively be attached to the bendable area BA by a first adhesive layer 81. In an embodiment, the first adhesive layer 81 may be provided at a center of the curved supporting side 46, and the first adhesive layer 81 in the first direction (e.g., the X-direction) may be narrower than the curved support unit 45 in the first direction (e.g., the X-direction).

A portion of the bendable area BA that corresponds to the complex support unit 40 is fixed to a plurality of curved support units 45 by the first adhesive layer 81, such that the bendable area BA may be less transformed and may be prevented or substantially prevented from lifting in the folded state. The foldable display device 200 according to an exemplary embodiment may be formed having a same or similar configuration as the above-described foldable display device 100 except for the addition of the first adhesive layer 81.

Figure 10:
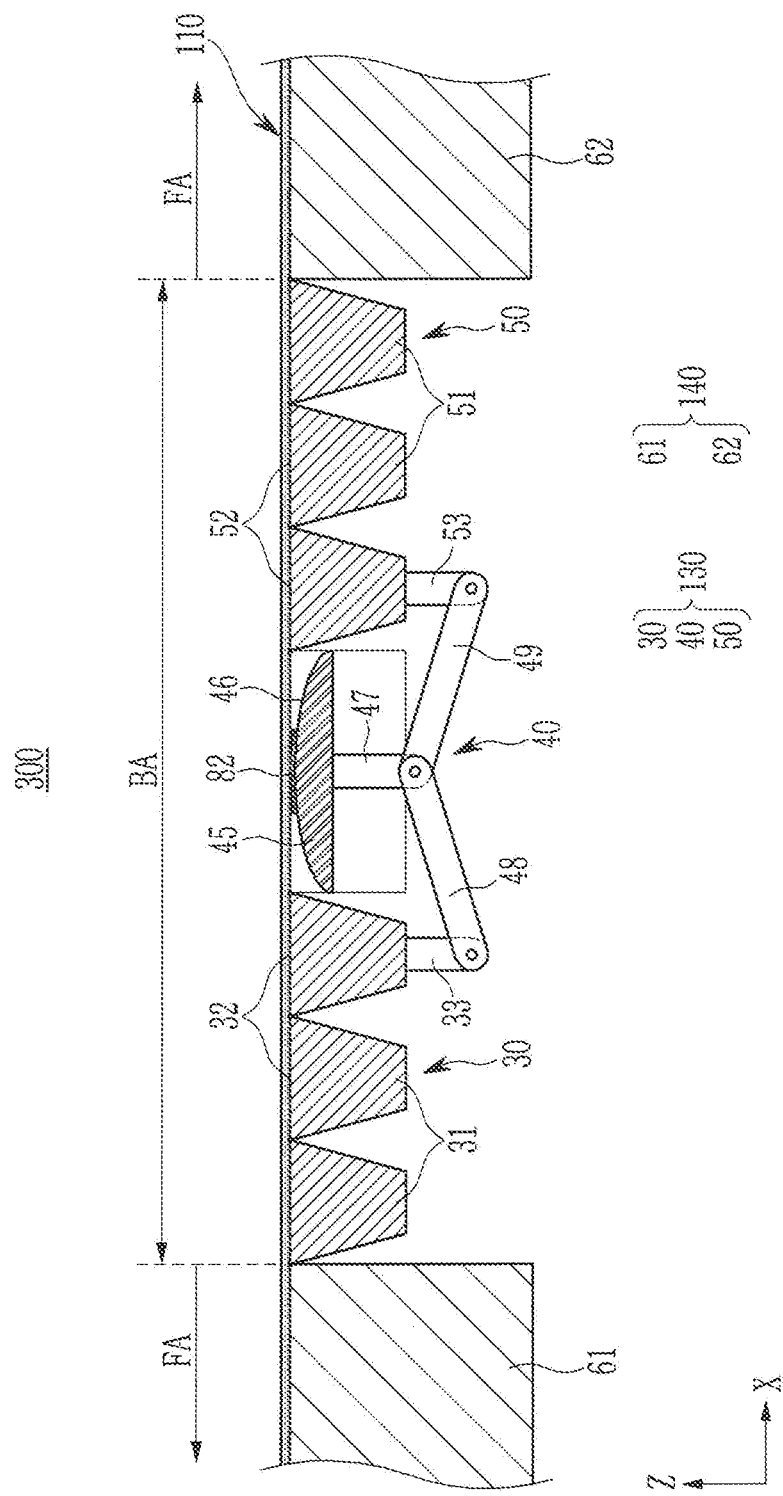
FIG. 10 shows a cross-sectional view of a foldable display device in an unfolded state according to another exemplary embodiment.
Figure 11:
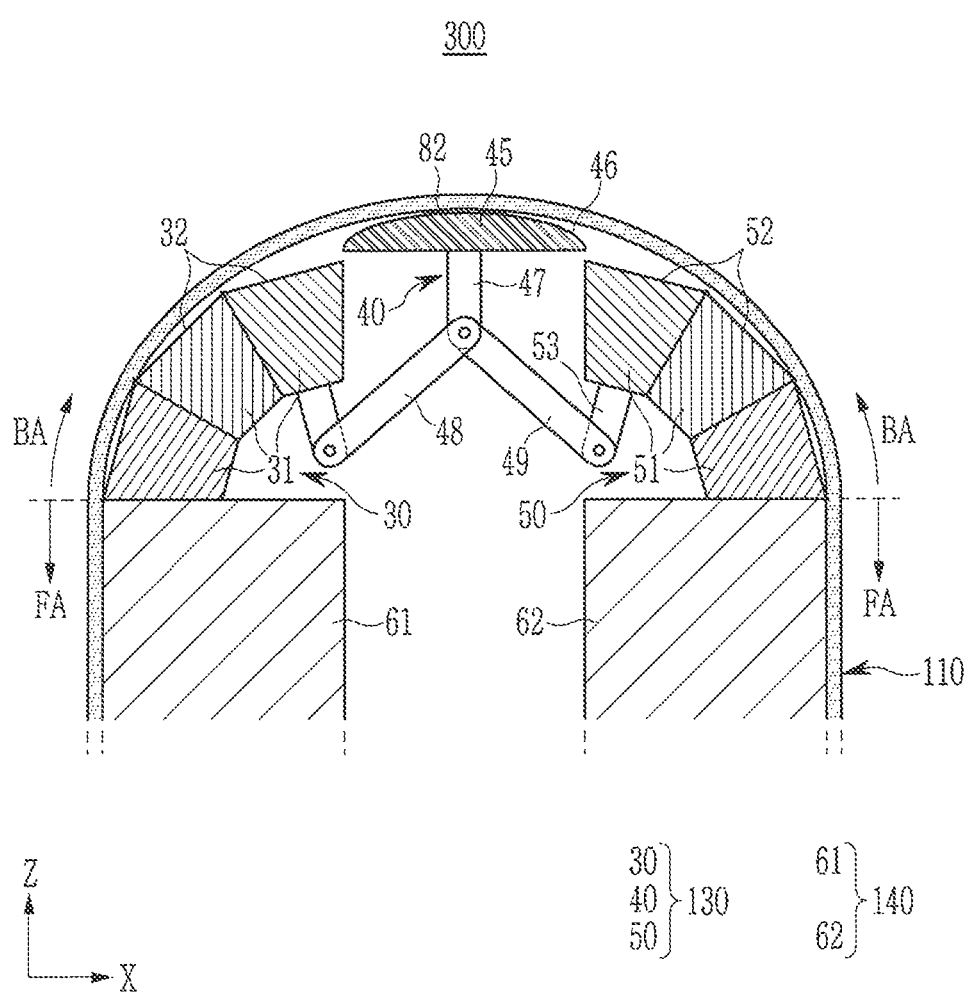
FIG. 11 shows a cross-sectional view of the foldable display device shown in FIG. 10, in a folded state.
Figure 12:
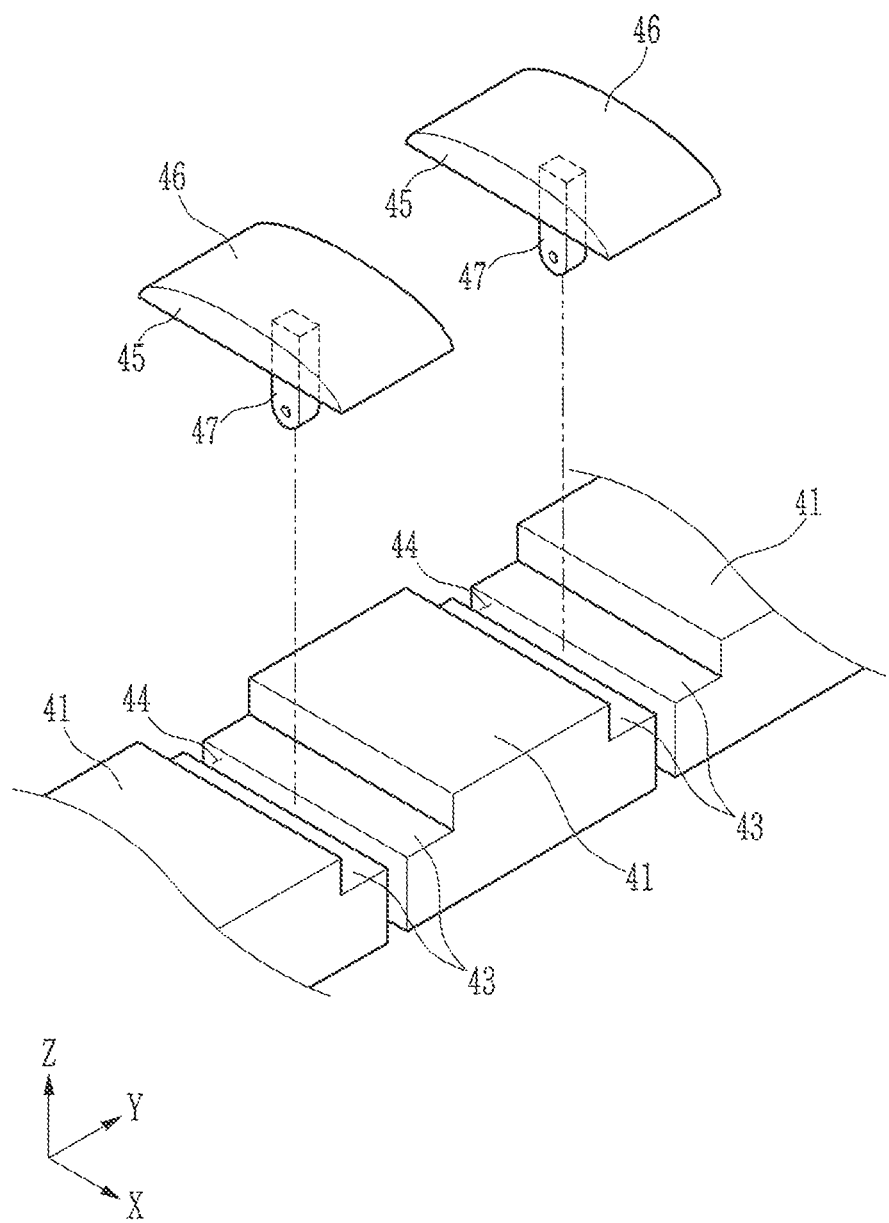
FIG. 12 shows an exploded perspective view of a complex support unit of the foldable display device shown in FIG. 10.

FIG. 10 shows a cross-sectional view of a foldable display device in an unfolded state according to another exemplary embodiment; and FIG. 11 shows a cross-sectional view of the foldable display device shown in FIG. 10, in a folded state. FIG. 12 shows an exploded perspective view of a complex support unit of the foldable display device shown in FIG. 10, according to an exemplary embodiment.

Referring to FIG. 10 to FIG. 12, regarding a foldable display device 300 according to another exemplary embodiment, a plurality of curved support units 45 respectively include a first link connector 47, and a first link member 48 and a second link member 49 are combined to the first link connector 47.

A prop 43 for supporting a curved support unit 45 may be divided into a plurality of portions by a through hole 44. In an embodiment, the through hole 44 is provided at a center of the prop 43 in parallel to the first direction (e.g., the X-direction), and passes through the prop 43 in the third direction (e.g., the Z-direction). The first link connector 47, the first link member 48, and the second link member 49 are provided in the through hole 44.

In an embodiment, when a complex support unit 40 is divided into a plurality of portions by the through hole 44, a plurality of flat support units 41 are combined to the neighboring first joint unit 31 and the neighboring second joint unit 51 by the combiner 70 (refer again to FIG. 1), such that the complex support unit 40 may be integrally combined to the first multi-joint member 30 and the second multi-joint member 50.

A plurality of curved support units 45 fall in the unfolded state and rise in the folded state by the first link member 48 and the second link member 49. In an embodiment, the curved support units 45 may be respectively attached to the bendable area BA by a second adhesive layer 82. In an embodiment, the second adhesive layer 82 may be provided at the center of the curved supporting side 46, and the second adhesive layer 82 in the first direction (e.g., the X-direction) may be narrower than the curved support unit 45 in the first direction (e.g., the X-direction).

The foldable display device 300 according to an exemplary embodiment may be formed having a same or similar configuration as the above-described foldable display device 200 except that one first link connector 47 is provided for a plurality of curved support units 45.

Figure 13:
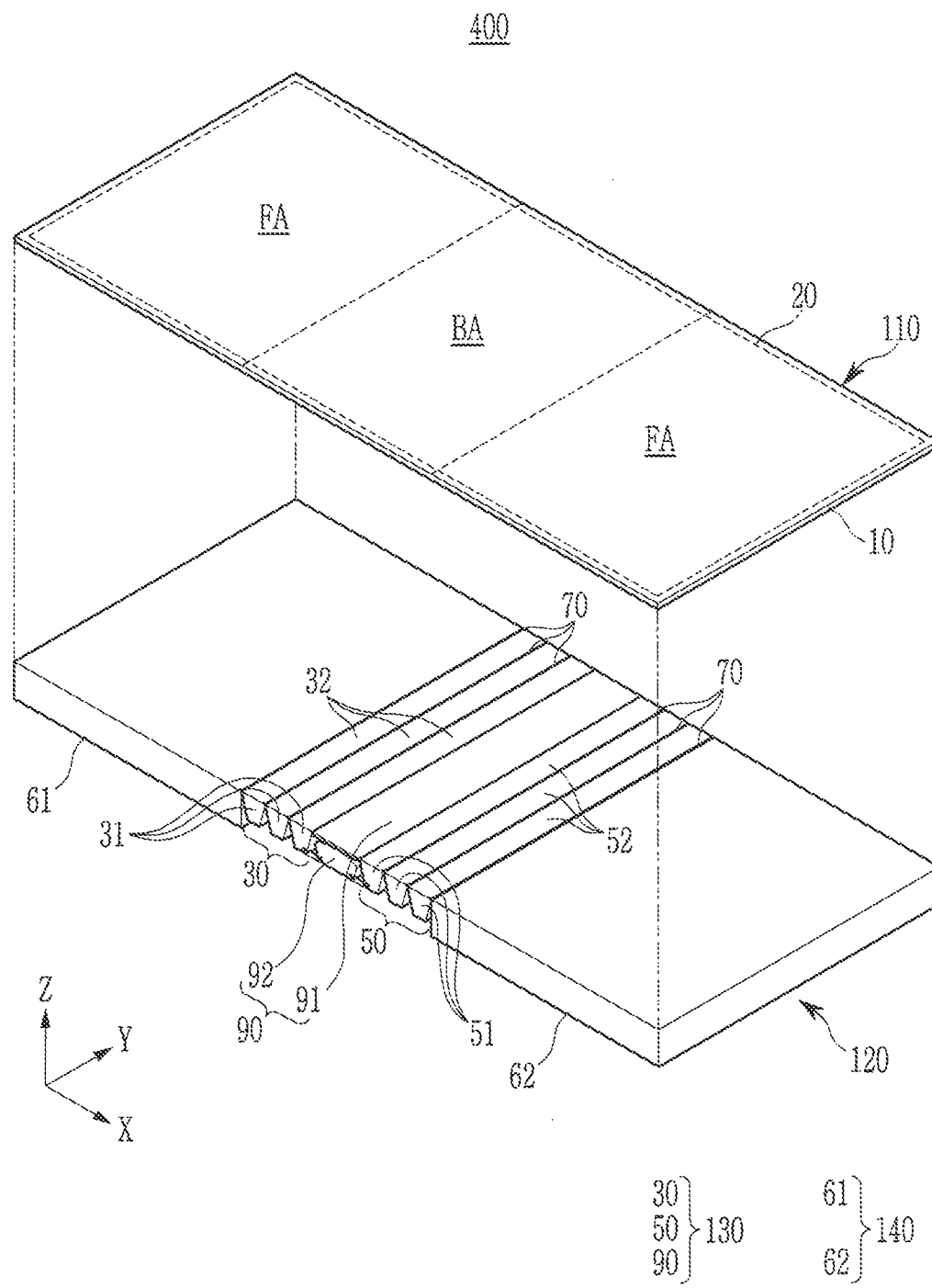
FIG. 13 shows an exploded perspective view of a foldable display device in an unfolded state according to another exemplary embodiment.
Figure 14:
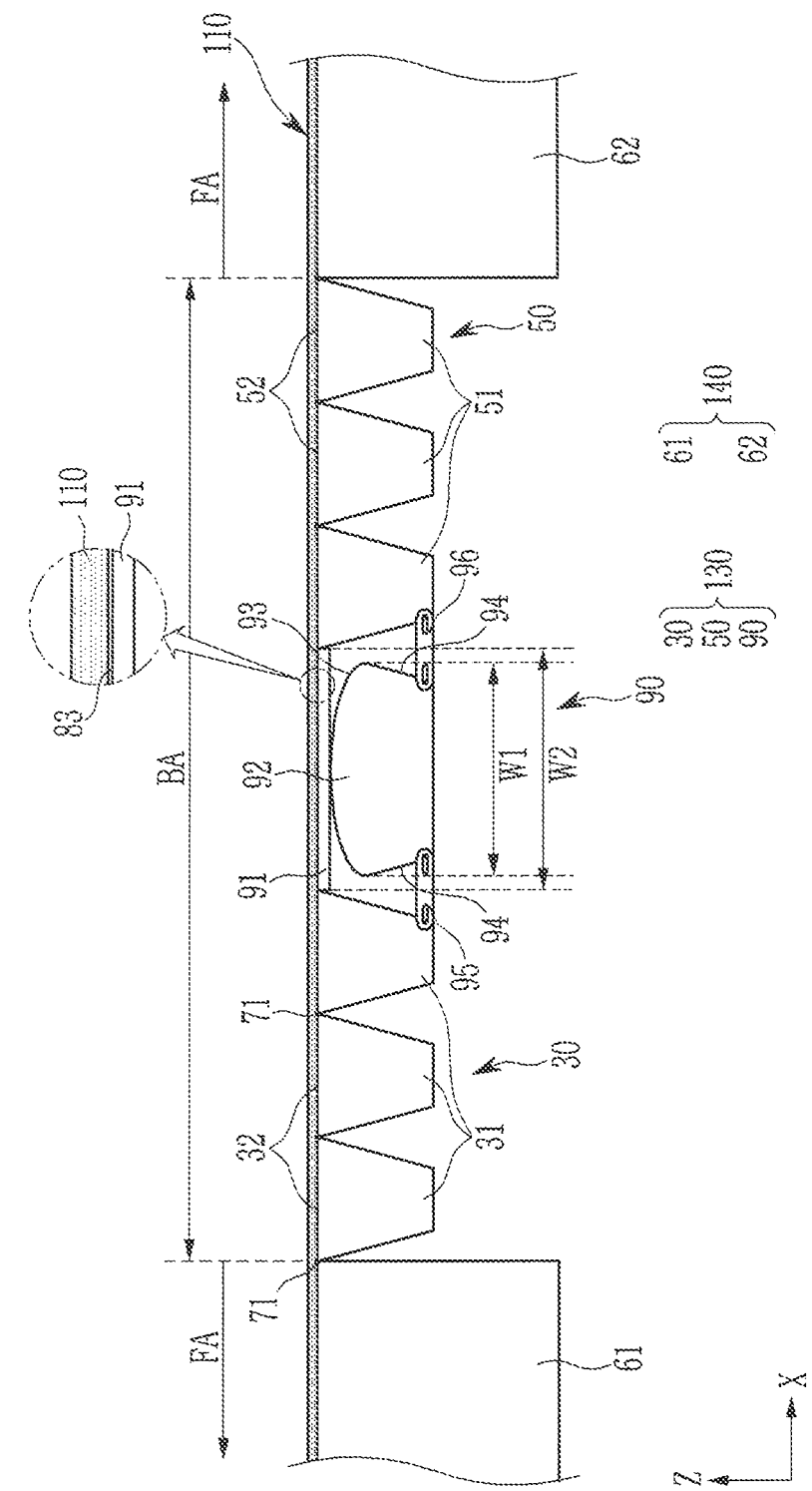
FIG. 14 shows a front view of the foldable display device of FIG. 13 in a combined state.

FIG. 13 shows an exploded perspective view of a foldable display device in an unfolded state according to another exemplary embodiment; and FIG. 14 shows a front view of the foldable display device of FIG. 13 in a combined state.

Referring to FIG. 13 and FIG. 14, a foldable display device 400 according to another exemplary embodiment includes a flexible display panel 110, and a panel supporter 120 combined to the flexible display panel 110 and supporting the flexible display panel 110. The panel supporter 120 includes a first supporter 130 for supporting the bendable area BA of the flexible display panel 110, and a second supporter 140 for supporting the flat area FA.

In an embodiment, the first supporter 130 may include a first multi-joint member 30, a complex support unit 90, and a second multi-joint member 50 consecutively arranged in the first direction (e.g., the X-direction). In an embodiment, the flexible display panel 110 and the second supporter 140 correspond to those of the above-described foldable display device 100. In an embodiment, the first multi-joint member 30 and the second multi-joint member 50 correspond to those of the above-described foldable display device 100 except that the second link connector 33 and the third link connector 53 according are omitted.

The complex support unit 90 includes a flexible board 91, and a curved support unit 92 overlapping with the flexible board 91.

The flexible board 91 is a board that may be bent in the first direction (e.g., the X-direction), and, for example, the flexible board 91 may be configured as a flexible metal plate. A first end of the flexible board 91 in the first direction (e.g., the X-direction) may be fixed to an edge of the first supporting side 32 included in the neighboring first joint unit 31, and a second end may be fixed to an edge of the second supporting side 52 included in the neighboring second joint unit 51.

In the unfolded state, the flexible board 91 is flat and is provided in parallel to the first supporting side 32 and the second supporting side 52 in the first direction (e.g., the X-direction). In the unfolded state, the first multi-joint member 30, the second multi-joint member 50, and the flexible board 91 support the bendable area BA.

The curved support unit 92 is provided on a lower portion of the flexible board 91, and the curved support unit 92 may have a bar shape extending in the second direction (e.g., the Y-direction). In an embodiment, the curved support unit 92 may include a curved supporting side 93 facing the flexible board 91, and a pair of slanted sides 94 connected to respective ends of the curved supporting side 93. The curved supporting side 93 may have an arc shape (e.g., a circular arc shape) that is convex toward the flexible board 91 in a cross-sectional view.

A length of the curved supporting side 93 in a circumference direction may correspond to a length of the flexible board 91 in the first direction (e.g., the X-direction). The flexible board 91 is flat and the curved supporting side 93 has an arc shape (e.g., a circular arc shape) in the unfolded state, such that a width W1 of the curved supporting side 93 in the first direction (e.g., the X-direction) is less than a width W2 of the flexible board 91 in the first direction (e.g., the X-direction).

In the unfolded state, a part of the curved supporting side 93 contacts the flexible board 91. The curved support unit 92 is spaced apart from the neighboring first joint unit 31 and the neighboring second joint unit 51 and may be link-combined to the neighboring first joint unit 31 and the neighboring second joint unit 51 by a third link member 95 and a fourth link member 96, respectively, at respective ends of the curved support unit 92 in the second direction (e.g., the Y-direction).

In an embodiment, for example, a plurality of pins may respectively be fixed to the respective ends of the curved support unit 92 in the second direction (e.g., the Y-direction), and one pin may be fixed to respective ends of the first joint unit 31 and the second joint unit 51 in the second direction (e.g., the Y-direction). In the unfolded state, a plurality of pins may be provided in parallel in the first direction (e.g., the X-direction).

In an embodiment, the third link member 95 and the fourth link member 96 may respectively include a plurality of linear holes. The third link member 95 may be combined to one of the pins fixed to the curved support unit 92 and the pin fixed to the first joint unit 31. The fourth link member 96 may be combined to the other of the pins fixed to the curved support unit 92 and the pin fixed to the second joint unit 51.

In an embodiment, a third adhesive layer 83 is provided between the bendable area BA and the flexible board 91, and the bendable area BA may be attached to the flexible board 91 by the third adhesive layer 83.

Figure 15:
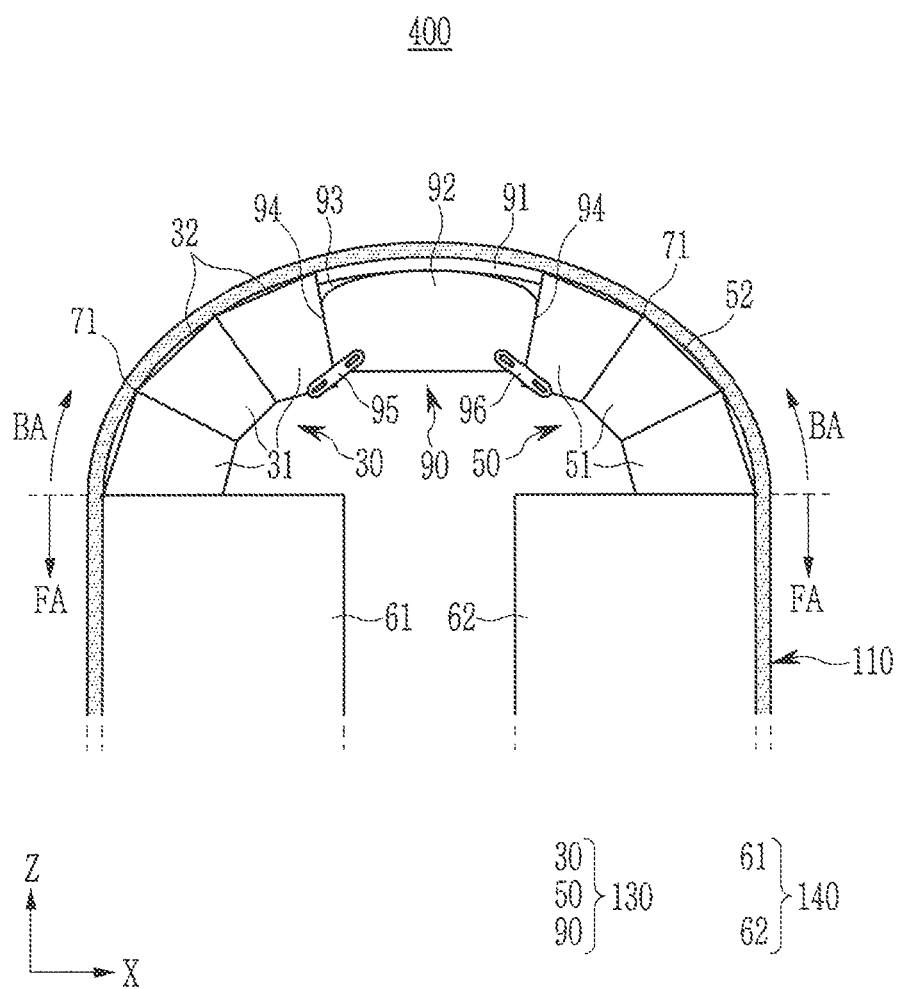
FIG. 15 shows a front view of the foldable display device of FIG. 13 in a folded state.

FIG. 15 shows a front view of the foldable display device of FIG. 13, in a folded state.

Referring to FIG. 15, regarding the foldable display device 400, a plurality of first joint units 31 and a plurality of second joint units 51 rotate with respect to their combination axes 71, the flexible board 91 is bent according to a curvature of the curved supporting side 93, and the bendable area BA of the flexible display panel 110 is bent to have an arc shape (e.g., a circular arc shape) and is switched to the folded state.

In an embodiment, in the folded state, the slanted sides 94 of the curved support unit 92 contact the side of the neighboring first joint unit 31 and the side of the neighboring second joint unit 51, and the flexible board 91 contacts most of the curved supporting side 93. A part of the bent flexible board 91 and the curved support unit 92 are provided higher than the first multi-joint member 30 and the second multi-joint member 50 in the positive third direction (e.g., the Z-direction) with reference to FIG. 15. This provides a same or similar result as the curved support unit rising in the above-described foldable display device 100.

The bendable area BA attached to the flexible board 91 is bent in the folded state along the flexible board 91, and is bent with a curvature that is close to a natural curvature without being limited to the first multi-joint member 30 and the second multi-joint member 50. The foldable display device 400 according to an exemplary embodiment may minimize or reduce the stress applied to the flexible display panel 110 in the folded state, and may prevent or substantially prevent the flexible display panel 110 from being damaged.

While this disclosure has been described in connection with what are presently considered to be some practical exemplary embodiments, it is to be understood that the present invention is not limited to the disclosed embodiments, but, on the contrary, is intended to cover various modifications and equivalent arrangements included within the spirit and scope of the appended claims.

What is claimed is:

1. A foldable display device comprising:
a flexible display panel including a bendable area; and
a first supporter including a first multi-joint member, a complex support unit, and a second multi-joint member consecutively arranged in a first direction, and supporting the bendable area,
wherein the complex support unit comprises:
a flat support unit combined to the first multi-joint member and the second multi-joint member in a rotatable manner with respect to a combination axis in parallel to a second direction crossing the first direction; and
a curved support unit neighboring the flat support unit in the second direction and combined to the first multi-joint member and the second multi-joint member such that a rising height of the curved support unit changes with respect to the flat support unit in a third direction crossing the first direction and the second direction according to a rotation state of the flat support unit relative to the first multi-joint member and the second multi-joint member.

2. The foldable display device of claim 1, wherein the flat support unit and the curved support unit are alternately and repeatedly arranged in the second direction crossing the first direction.

3. The foldable display device of claim 2, wherein
the first multi-joint member includes a plurality of first supporting sides,
the second multi-joint member includes a plurality of second supporting sides, and
the flat support unit includes a flat supporting side parallel to the first supporting sides and the second supporting sides in an unfolded state.

4. The foldable display device of claim 3, wherein
the curved support unit includes a curved supporting side having an arc shape in a cross-sectional view, and
in the unfolded state, an uppermost end of the curved supporting side is provided in parallel to the flat supporting side.

5. The foldable display device of claim 4, wherein the curved supporting side has a circular arc shape in the cross-sectional view.

6. The foldable display device of claim 4, wherein
the curved support unit includes a first link connector fixed to a lower portion of the curved supporting side, and
the first multi-joint member and the second multi-joint member respectively include a second link connector and a third link connector neighboring the first link connector.

7. The foldable display device of claim 6, wherein
the complex support unit further includes a first link member and a second link member,
respective ends of the first link member are hinge-combined to the first link connector and the second link connector, and
respective ends of the second link member are hinge-combined to the first link connector and the third link connector.

8. The foldable display device of claim 7, wherein
the first link connector is provided as a pair of first link connectors, and
one of the pair of first link connectors is combined to the first link member, and the other of the pair of first link connectors is combined to the second link member.

9. The foldable display device of claim 1, wherein
the flexible display panel further includes a flat area contacting the bendable area,
the foldable display device further includes a second supporter for supporting the flat area, and
the flat area is attached to the second supporter.

10. The foldable display device of claim 9, wherein the bendable area is not attached to the first supporter.

11. The foldable display device of claim 9, wherein
the bendable area is attached to the curved support unit by a first adhesive layer, and
the first adhesive layer in the first direction is narrower than the curved support unit in the first direction.

12. The foldable display device of claim 1, wherein, in a folded state, the bendable area is bent to have an outwardly convex arc shape at an outward-facing surface of the bendable area, and the curved support unit is arranged at a side of the bendable area opposite the outward-facing surface.

13. A foldable display device comprising:
a flexible panel including a bendable area; and
a first supporter including a first multi-joint member, a complex support unit, and a second multi-joint member consecutively arranged in a first direction, rotatably combined with one another so as to be rotatable about an axis extending in a second direction crossing the first direction, and supporting the bendable area,
wherein the complex support unit comprises:
a flexible board including respective ends in the first direction that are fixed to the first multi-joint member and the second multi-joint member;
a curved support unit overlapping with the flexible board and the bendable area along a third direction crossing the first direction and the second direction, and including a curved supporting side facing the flexible board; and
an adhesive layer between the bendable area and the flexible board, the adhesive layer attaching the bendable area to the flexible board.

14. The foldable display device of claim 13, wherein
the curved supporting side has an arc shape in a cross-sectional view, and
in an unfolded state, the flexible board is flat and contacts a central part of the curved supporting side.

15. The foldable display device of claim 14, wherein the curved supporting side has a circular arc shape in the cross-sectional view.

16. The foldable display device of claim 13, wherein, in a folded state, the bendable area is bent to have an outwardly convex arc shape at an outward-facing surface of the bendable area, and the curved support unit is arranged at a side of the bendable area opposite the outward-facing surface.

17. A foldable display device comprising:
- a flexible panel including a bendable area; and
- a first supporter including a first multi-joint member, a complex support unit, and a second multi-joint member consecutively arranged in a first direction, and supporting the bendable area, wherein the complex support unit comprises:
- a flexible board including respective ends in the first direction that are fixed to the first multi-joint member and the second multi-joint member; and
- a curved support unit overlapping with the flexible board, and including a curved supporting side facing the flexible board, wherein
the curved supporting side has an arc shape in a cross-sectional view, and
in an unfolded state, the flexible board is flat and contacts a central part of the curved supporting side, and wherein
the flexible board is bent along the curved supporting side in a folded state, and
a contact area of the flexible board and the curved supporting side in the folded state is greater than a contact area of the flexible board and the curved supporting side in the unfolded state.

18. The foldable display device of claim 17, wherein respective sides of the curved support unit in the first direction are spaced apart from the first multi-joint member and the second multi-joint member in the unfolded state, and contact a side of the first multi-joint member and a side of the second multi-joint member in the folded state.

19. The foldable display device of claim 18, wherein respective ends of the curved support unit in a second direction crossing the first direction are combined to the first multi-joint member and the second multi-joint member by a third link member and a fourth link member.

* * * * *